(12) United States Patent
Ma et al.

(10) Patent No.: US 7,804,344 B2
(45) Date of Patent: Sep. 28, 2010

(54) PERIODIC SIGNAL SYNCHRONIZATION APPARATUS, SYSTEMS, AND METHODS

(75) Inventors: Yantao Ma, Boise, ID (US); Jeffrey P. Wright, Boise, ID (US); Dong Pan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 221 days.

(21) Appl. No.: 11/788,442

(22) Filed: Apr. 20, 2007

(65) Prior Publication Data
US 2008/0258785 A1 Oct. 23, 2008

(51) Int. Cl.
*H03L 7/06* (2006.01)

(52) U.S. Cl. ............... 327/158; 327/147; 327/156; 327/161

(58) Field of Classification Search ............... 327/149, 327/158
See application file for complete search history.

(56) References Cited

U.S. PATENT DOCUMENTS

| 6,774,690 | B2 | 8/2004 | Baker | |
|---|---|---|---|---|
| 6,836,166 | B2 * | 12/2004 | Lin et al. | 327/158 |
| 6,917,230 | B2 | 7/2005 | Miller | |
| 6,982,579 | B2 * | 1/2006 | Lee | 327/158 |
| 7,042,260 | B2 | 5/2006 | Choi | |
| 7,277,357 | B1 * | 10/2007 | Ma | 365/233.12 |
| 2003/0001635 | A1 * | 1/2003 | Lee et al. | 327/158 |

* cited by examiner

*Primary Examiner*—Lincoln Donovan
*Assistant Examiner*—John W Poos
(74) *Attorney, Agent, or Firm*—Schwegman, Lundberg & Woessner, P.A.

(57) ABSTRACT

Apparatus, systems, and methods are disclosed that operate to generate a periodic output signal from a periodic input signal, obtain a plurality of samples of a phase difference between the output signal and the input signal, and to adjust a phase of the output signal based on the samples of the phase difference. Additional apparatus, systems, and methods are disclosed.

20 Claims, 12 Drawing Sheets

US 7,804,344 B2

PERIODIC SIGNAL SYNCHRONIZATION APPARATUS, SYSTEMS, AND METHODS

FIELD

This disclosure relates to periodic signal synchronization in electronic devices.

BACKGROUND

Delay lock loop (DLL) circuits and phase lock loop (PLL) circuits are used to generate a periodic signal such as a clock signal based on a periodic reference signal from, for example, an oscillator. The generated clock signal should maintain a specific phase relationship with the reference signal to be synchronized. A DLL circuit or a PLL circuit will adjust the phase of the generated clock signal to maintain the desired phase relationship. DLL and PLL circuits are used, for example, in high-speed clocked memories such as synchronous dynamic random access memory (SDRAM) devices.

Jitter, noise, and other factors sometimes interfere with the operation of DLL and PLL circuitry, so that the desired degree of synchronization is not maintained. Thus, there is a need for improved apparatus, systems, and methods to improve periodic signal synchronization in various electronic devices.

DETAILED DESCRIPTION

Figure 1:
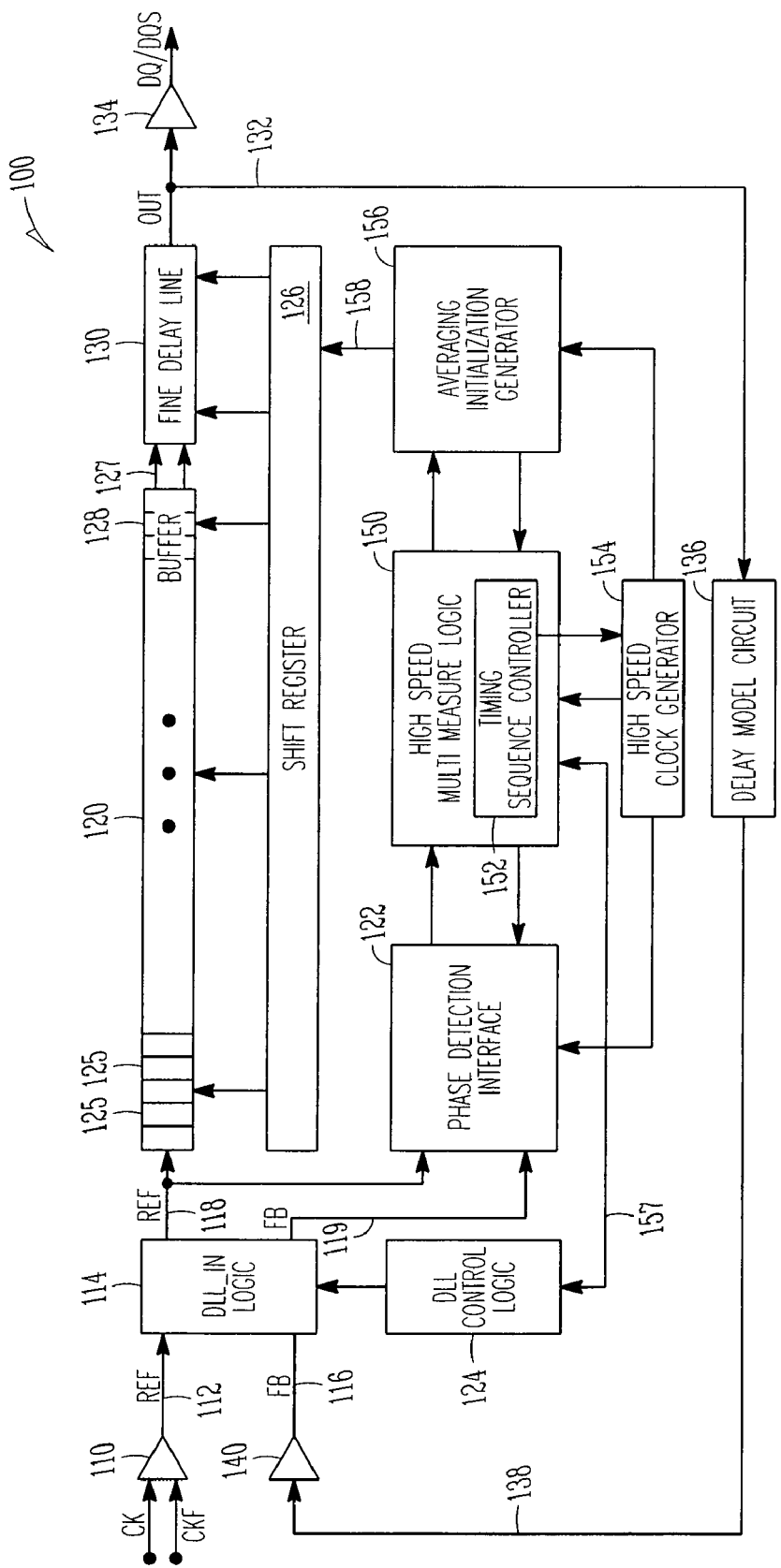
FIG. 1 is a block diagram of a DLL according to an embodiment of the invention.

FIG. 1 is a block diagram of a DLL 100 according to an embodiment of the invention. An input buffer 110 is coupled to receive a periodic signal CK and an inverse periodic signal CKF. The signals CK and CKF are received from a source external to the DLL 100, and may be generated by an oscillator. The input buffer 110 generates a periodic reference signal on a line 112 that is coupled to an interface control circuit 114. The interface control circuit 114 is also coupled to receive a feedback signal on a line 116, and a generation of the feedback signal will be discussed below.

The interface control circuit 114 couples the reference signal on a line 118 to a coarse variable delay line 120, and couples the feedback signal on a line 119 and the reference signal on the line 118 to a phase detection interface circuit 122. In some embodiments, the signals on the lines 118, 119 are clock signals. The interface control circuit 114 is coupled to receive a control signal from a control logic circuit 124 to shut it off and save power when possible.

The coarse variable delay line 120 includes a series connection of a plurality of delay elements 125 that impart a delay to the reference signal according to instructions from a shift register 126 coupled to the coarse variable delay line 120. The shift register 126 contains binary bits used to select an entry point for the reference signal into the coarse variable delay line 120, and the entry point determines the number of delay elements that the reference signal is coupled through in the coarse variable delay line 120. The coarse variable delay line 120 generates a delayed reference signal on a pair of lines 127. A selected number of the delay elements in the coarse variable delay line 120 are included in a buffer 128, and these delay elements always impart delay to the reference signal.

The delayed reference signal on the lines 127 is coupled to a fine variable delay line 130 that imparts a further delay to the reference signal based on instructions from the shift register 126. The fine variable delay line 130 generates an output signal on a line 132 that is further delayed from the reference signal according to the instructions from the shift register 126. The binary bits in the shift register 126 are used to select an entry point for the delayed reference signal in the fine variable delay line 130. Each delay element in the coarse variable delay line imparts a greater delay to the reference signal when compared to the delay imparted by each delay element in the fine variable delay line 130.

An output buffer 134 couples the output signal to pins DQ and DQS (not shown). The output signal on a line 132 is also coupled through delay model circuit 136 that mimics a timing delay external to the DLL 100 in order to generate a feedback signal on a line 138. The feedback signal on the line 138 is further coupled through a replica buffer circuit 140 that is a replica of the input buffer 110 to impart a delay to the feedback signal similar to the delay imparted by the input buffer circuit 110. The replica buffer circuit 140 generates the feedback signal on the line 116.

The phase detection interface circuit 122 detects a phase difference between the reference signal and the feedback signal on the lines 118 and 119, respectively. Information about the phase difference in a phase difference signal is coupled to a high speed multi measure logic circuit 150 that includes a timing sequence controller circuit 152. A high speed clock generator circuit 154 generates a high speed clock signal that is coupled to the phase detection interface circuit 122, the high speed multi measure logic circuit 150, the timing sequence controller circuit 152, and to an averaging initialization generator circuit 156. In some embodiments, the high speed multi measure logic circuit 150 and the timing sequence controller circuit 152 are included in a digital signal processor (DSP). The high speed multi measure logic circuit 150 is coupled to exchange information with the control logic circuit 124 over a line 157.

In some embodiments, the high speed clock generator circuit 154 comprises a ring oscillator circuit. The high speed multi measure logic circuit 150 and the timing sequence controller circuit 152 determine an average phase difference between the reference signal and the feedback signal on the lines 118, 119 based on multiple samples of the phase difference from the phase detection interface circuit 122. Information about the average phase difference is coupled to the averaging initialization generator circuit 156 which is coupled to the shift register 126 on line 158. The averaging initialization generator circuit 156 is coupled to change binary bits in the shift register 126 to change, in turn, the delay imparted by the coarse variable delay line 120 and the fine variable delay line 130. Operation of the phase detection interface circuit 122, the high speed multi measure logic circuit 150, the timing sequence controller circuit 152, the high speed clock generator circuit 154, and the averaging initialization generator circuit 156 will be further described herein below.

Figure 2:
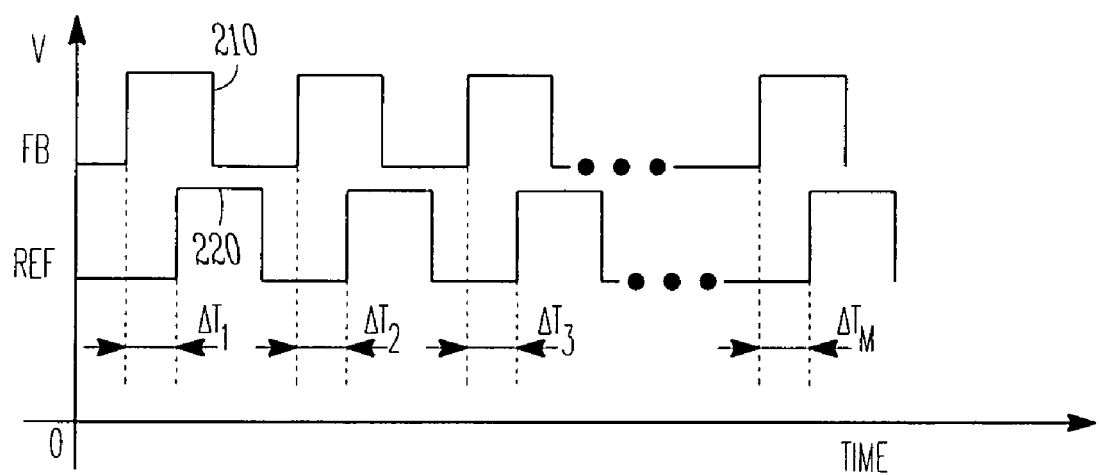
FIG. 2 is a diagram of a periodic feedback signal and a periodic reference signal associated with the DLL of FIG. 1 according to an embodiment of the invention.

FIG. 2 is a diagram of a periodic feedback signal 210 and a periodic reference signal 220 associated with the DLL 100 of FIG. 1 according to an embodiment of the invention. The feedback signal 210 corresponds to the feedback signal on the lines 116,119 shown in FIG. 1, and the reference signal 220 corresponds to the reference signal on the lines 112,118 shown in FIG. 1. The reference signal 220 and the feedback signal 210 include broken lines to indicate portions of the signal that are repeated and not shown for purposes of brevity. A phase difference ΔT exists between the reference signal 220 and the feedback signal 210, and this phase difference ΔT can be detected for each period of the signals 210, 220. For example, the phase difference ΔT is shown at M different intervals in FIG. 2, at $\Delta T_1$, $\Delta T_2$, and $\Delta T_3$ through to $\Delta T_M$. A phase difference between the feedback signal 210 and the reference signal 220 is a delay interval between corresponding transitions (e.g. edges) of the signals 210, 220.

Figure 3:
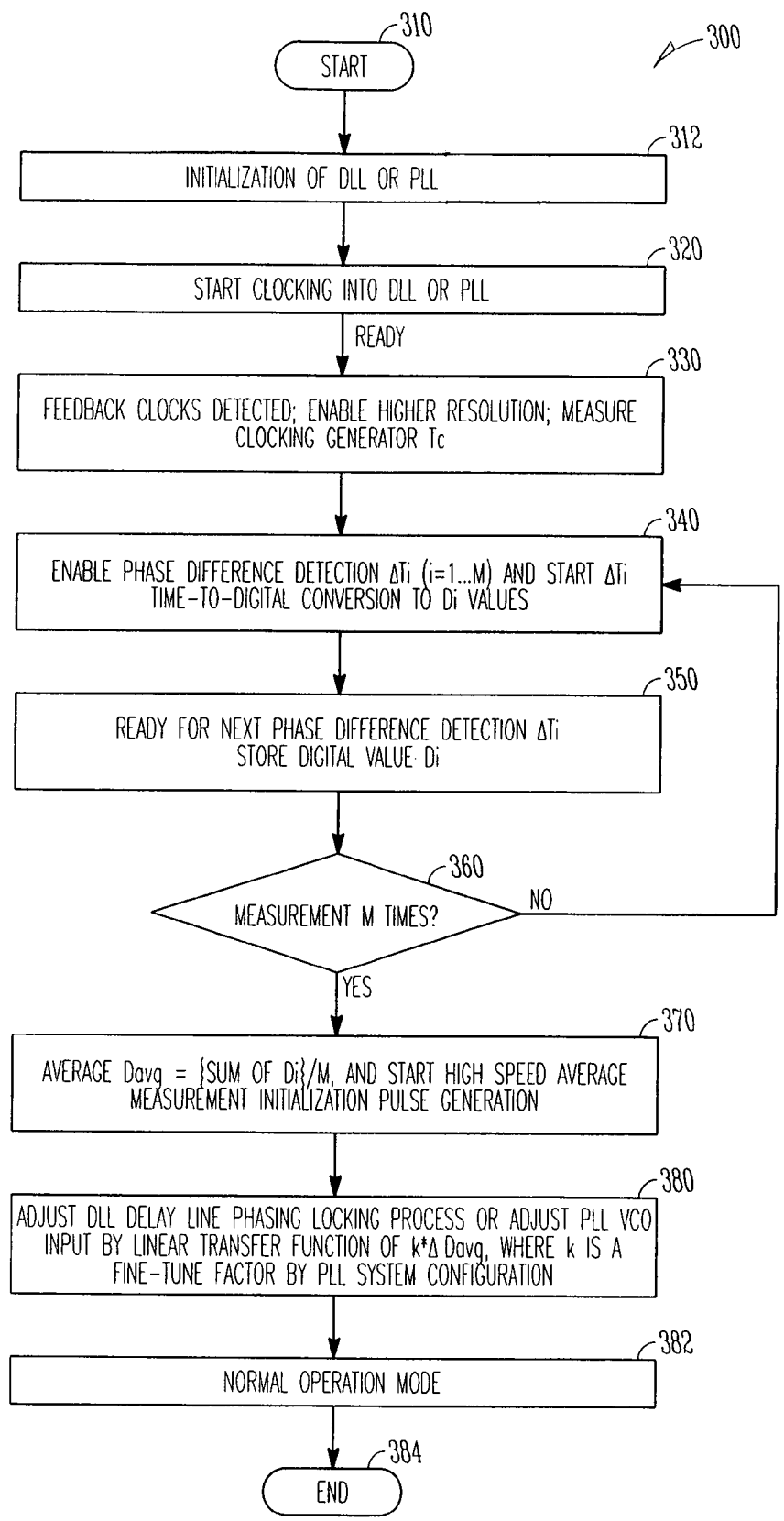
FIG. 3 is a flow diagram of several methods associated with the operation of the DLL in FIG. 1 according to an embodiment of the invention.

FIG. 3 is a flow diagram of several methods 300 associated with the operation of the DLL 100 in FIG. 1 according to an embodiment of the invention. The methods also express the operation of a PLL including similar elements, and this PLL portion is described below.

The methods 300 start in block 310. In block 312, the DLL 100 is initialized. In block 320, the reference signal on the line 112 begins to be generated and clocked into the interface control circuit 114. In block 330, the feedback signal on the line 116 is detected, the high speed clock generator circuit 154 begins to generate a high speed clock signal, and a clocking generator period Tc of the feedback signal is measured.

In block 340, the phase detection interface circuit 122 is enabled to detect multiple phase differences ΔTi between the reference signal on the line 118 and the feedback signal on the line 119 where i ranges from 1 to an integer M. Also in block 340, a time-to-digital conversion of the phase differences ΔTi begins, and the phase differences ΔTi are converted into digital data Di. In block 350, the phase detection interface circuit 122 is made ready to detect the next phase difference ΔTi, and the high speed multi-measure logic circuit 150 stores the current value Di. In block 360, the methods 300 determine if M phase differences ΔT have been measured, and if not, the methods 300 return to block 340 where another phase difference ΔTi is detected and converted into digital data Di.

If the methods 300 determine in block 360 that M samples ΔTi of the phase difference ΔT have been measured and converted into digital data Di, then in block 370 the methods 300 calculate an average Davg of the samples by summing the digital data Di, and dividing the sum by the integer M. Also in block 370, the averaging initialization generator circuit 156 generates an average pulse width based on the average Davg of the phase difference. In block 380, the averaging initialization generator circuit 156 updates the shift register 126 with new binary bits to adjust the phase locking of the variable delay lines 120,130. In particular, an enable token is sent through the variable delay lines 120,130 starting from a beginning edge of the average pulse width and stopping on a disable edge of the average pulse width. Shift control logic (not shown) is then used to latch in or register binary bits in the shift register 126 based on the enable token. In block 382, a normal operation mode begins, and in block 384, the methods 300 end.

Figure 4:
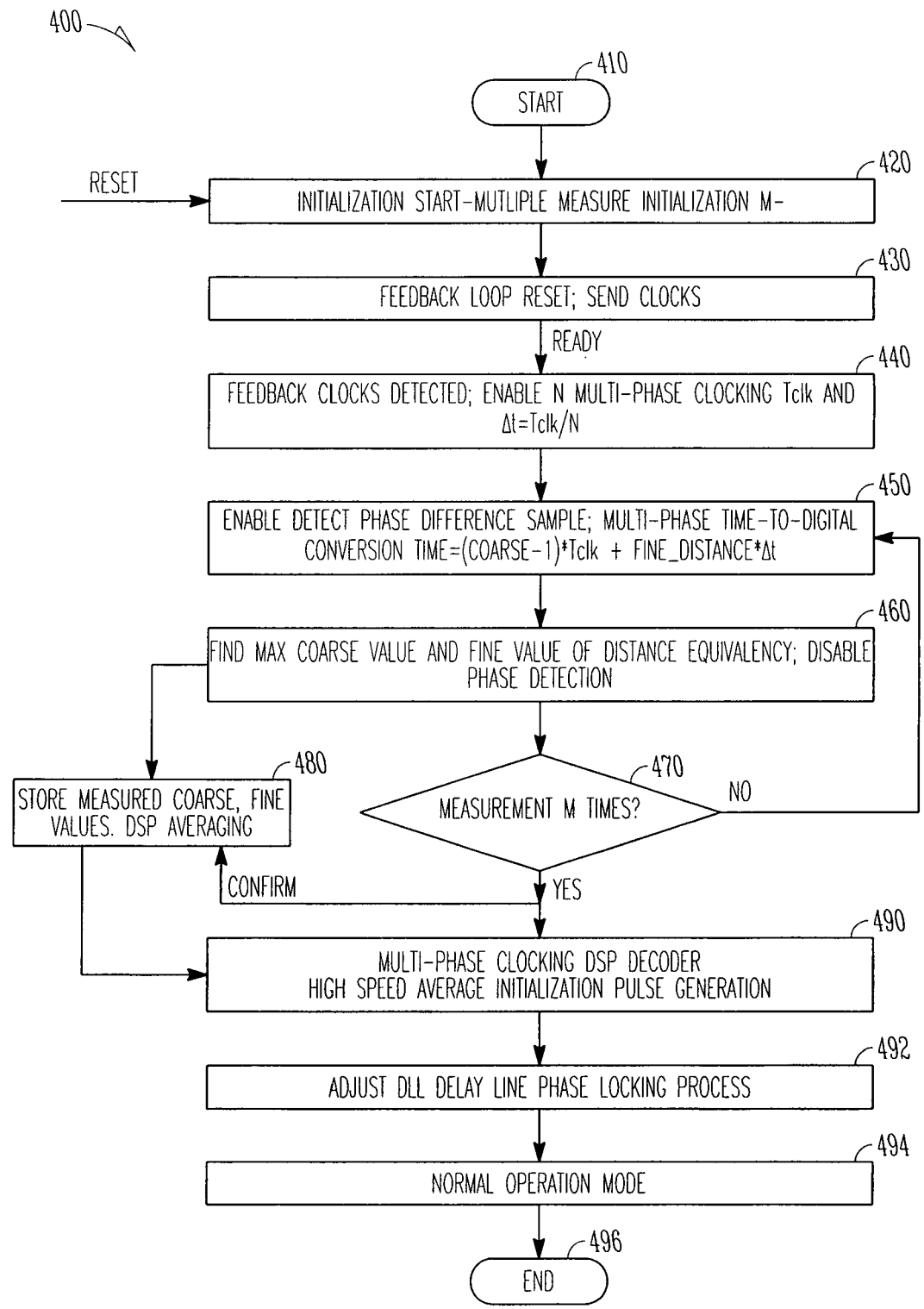
FIG. 4 is a flow diagram of several methods associated with the operation of the DLL in FIG. 1 according to an embodiment of the invention.
Figure 5:
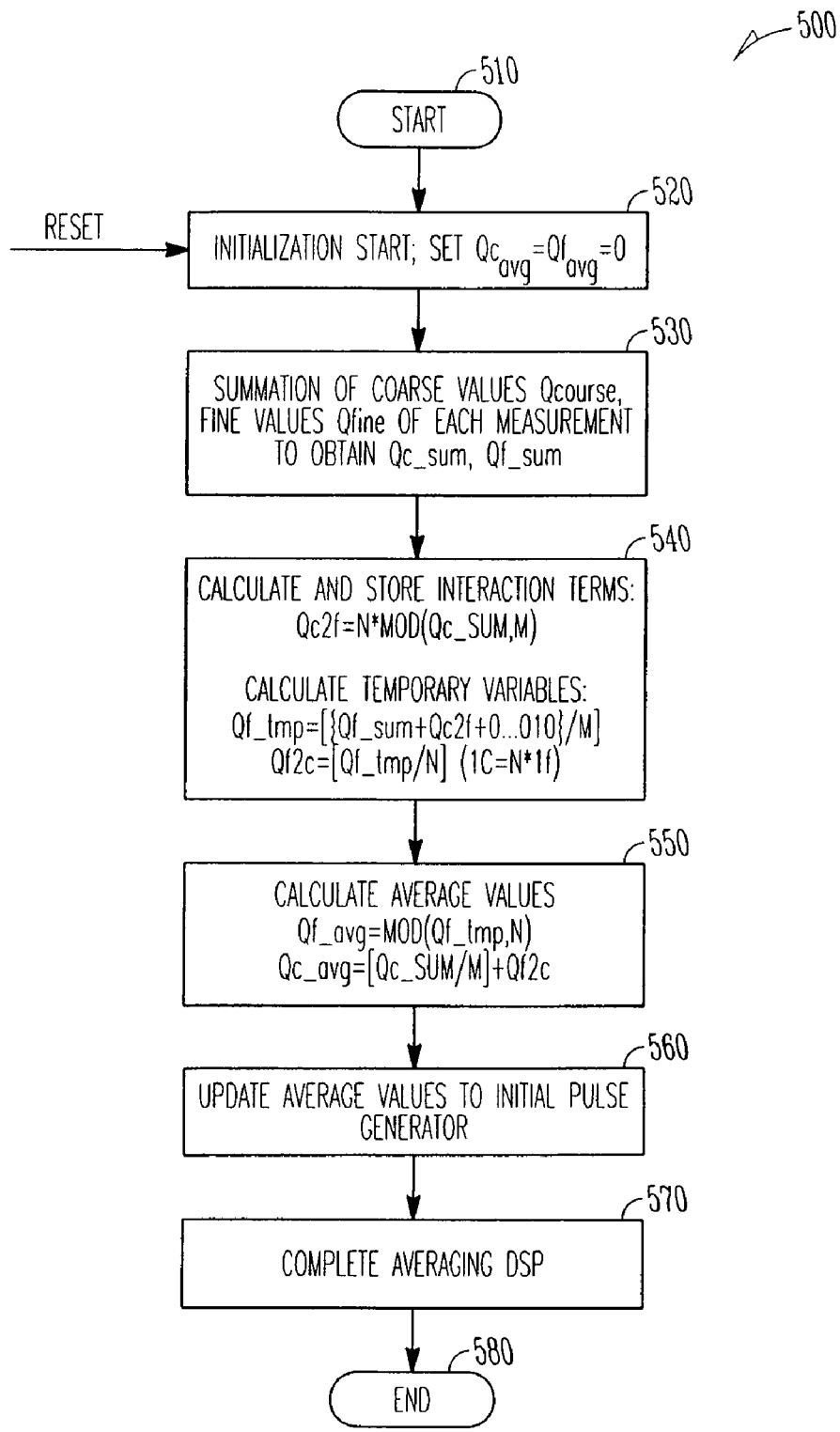
FIG. 5 is a flow diagram of several methods associated with the operation of the DLL in FIG. 1 according to an embodiment of the invention.

FIG. 4 is a flow diagram of several methods 400 associated with the operation of the DLL 100 in FIG. 1 according to an embodiment of the invention. FIG. 5 is a flow diagram of several methods 500 associated with the operation of the DLL 100 in FIG. 1 according to an embodiment of the invention, and will be described along with the methods 400. That is, the methods 400 and 500 show the operation of the DLL 100 in some embodiments distinguished from the methods 300 shown in FIG. 3.

The methods 400 start in block 410. In block 420, an integer M is selected to determine a number of samples of a phase difference that will be measured in the methods 400. In block 430, a feedback loop including the delay model circuit 136 and the replica buffer circuit 140 is reset, and a reference clock signal on the line 112 is coupled to the interface control circuit 114. In block 440, a feedback clock signal on the line 116 is detected, and the high speed clock generator circuit 154 is enabled to generate a multi-phase clock signal having N phases, where N is an integer, and each phase has a period approximately equal to a period of the reference clock signal on the line 118. The phase of the reference clock signal on line 118 is Tclk, and a phase difference Δt between each of the N multi phase clock signals is Tclk divided by N.

In block 450, the phase detection interface circuit 122 is enabled to detect a phase difference between the reference clock signal on the line 118 in the feedback clock signal on the line 119. Also in block 450, the high speed multi measure logic circuit 150 and the timing sequence controller circuit 152 are enabled to carry out a time-to-digital conversion of the phase difference based on the multi-phase clock signal generated by the high speed clock generator circuit 154.

The coarse value and the fine value of the phase difference are determined in the following manner. The measurement of a phase difference between an edge of the reference clock signal on the line 118 and an edge of the feedback clock signal on the line 119 is carried out by a comparison with the N multi-phase clock signals. Between edges of the signals on the lines 118, 119, a phase difference detector for each multi-phase clock signal detects when an edge of that multi-phase clock signal occurs, and a counter is incremented by one. There are N phase difference detectors and N counters that count up during the phase difference. The N counters each begin at 0. When the edges defining the phase difference have passed, the data in the counters is used to find the length of the phase difference. A Coarse value is the value in the counter. A Fine value is the number of counters having the highest or maximum Coarse value. The duration (e.g. Time) of the phase difference is calculated by formula (1) where * indicates multiplication:

$$\text{Time} = (\text{Coarse} - 1) * Tclk + \text{Fine} * \Delta t \qquad (1)$$

In block 460, the maximum Coarse value and a Fine value of distance equivalency of a sample are determined. The distance equivalency is the number of counters having the same value. Also in block 460, the phase detection interface circuit 122 is disabled. In block 470, the methods 400 determine if M different samples of the phase difference have been measured, and if not, the methods return to the block 450 where the phase detection interface circuit 122 is enabled and another sample of the phase difference is measured. Each time the maximum Coarse value and the Fine value of distance equivalency are determined in block 460, those values are stored in block 480. If, in block 470, the methods 400 determine that M samples of the phase difference have been measured, the high speed multi measure logic circuit 150 performs DSP averaging in block 480 according to the methods 500 shown in FIG. 5.

In block 510 of FIG. 5, the methods 500 begin. In block 520, there is an initialization start and two average variables Qc_avg and Qf_avg are set to zero. In block 530, the Coarse values Qcoarse are summed to obtain a variable Qc_sum, and the Fine values Qfine are summed to obtain a variable Qf_sum. In block 540, interaction terms and temporary variables are calculated according to the following equations. In these equations, the modulo function (mod) is used to find the remainder of division of one number by another. Z mod M is the remainder of a division of Z by M.

$$Qc2f = N*mod(Qc\_sum,M) \quad (2)$$

$$Qf\_tmp = [\{Qf\_sum + Qc2f + 0 \ldots 010\}/M] \quad (3)$$

$$Qf2c = [Qf\_tmp/N] \quad (4)$$

In these equations, C=N*f. In block 550, average values are then calculated according to the following formulas:

$$Qf\_avg = mod(Qf\_tmp,N) \quad (5)$$

$$Qc\_avg = [Qc\_sum/M] + Qf2c \quad (6)$$

In block 560, the average values are updated to the averaging initialization generator circuit 156, and in block 570, the averaging DSP is complete. The averaging in the methods 400 and 500 is carried out by a DSP. In block 580, the methods 500 end.

Returning to the methods 400 shown in FIG. 4, in block 490 multi-phase clocking DSP decoder high speed average initialization pulse generation is carried out by the averaging initialization generator circuit 156. The averaging initialization generator circuit 156 generates an average pulse width based on the average values Qf_avg and Qc_avg of the phase difference using the same multi-phase clock that was used to sample the phase differences. The use of the same multi-phase clock should improve the fidelity of the digital method.

In block 492, the averaging initialization generator circuit 156 updates the shift register 126 with new binary bits to adjust the phase locking of the variable delay lines 120,130 of the DLL 100. In particular, an enable token is sent through the variable delay lines 120,130 starting from a beginning edge of the average initialization pulse and stopping on a disable edge of the average initialization pulse. Shift control logic (not shown) is then used to latch in or register binary bits in the shift register 126 based on the enable token. In block 494, a normal operation mode of the DLL 100 begins, and in block 496 the methods 400 end.

Figure 6:
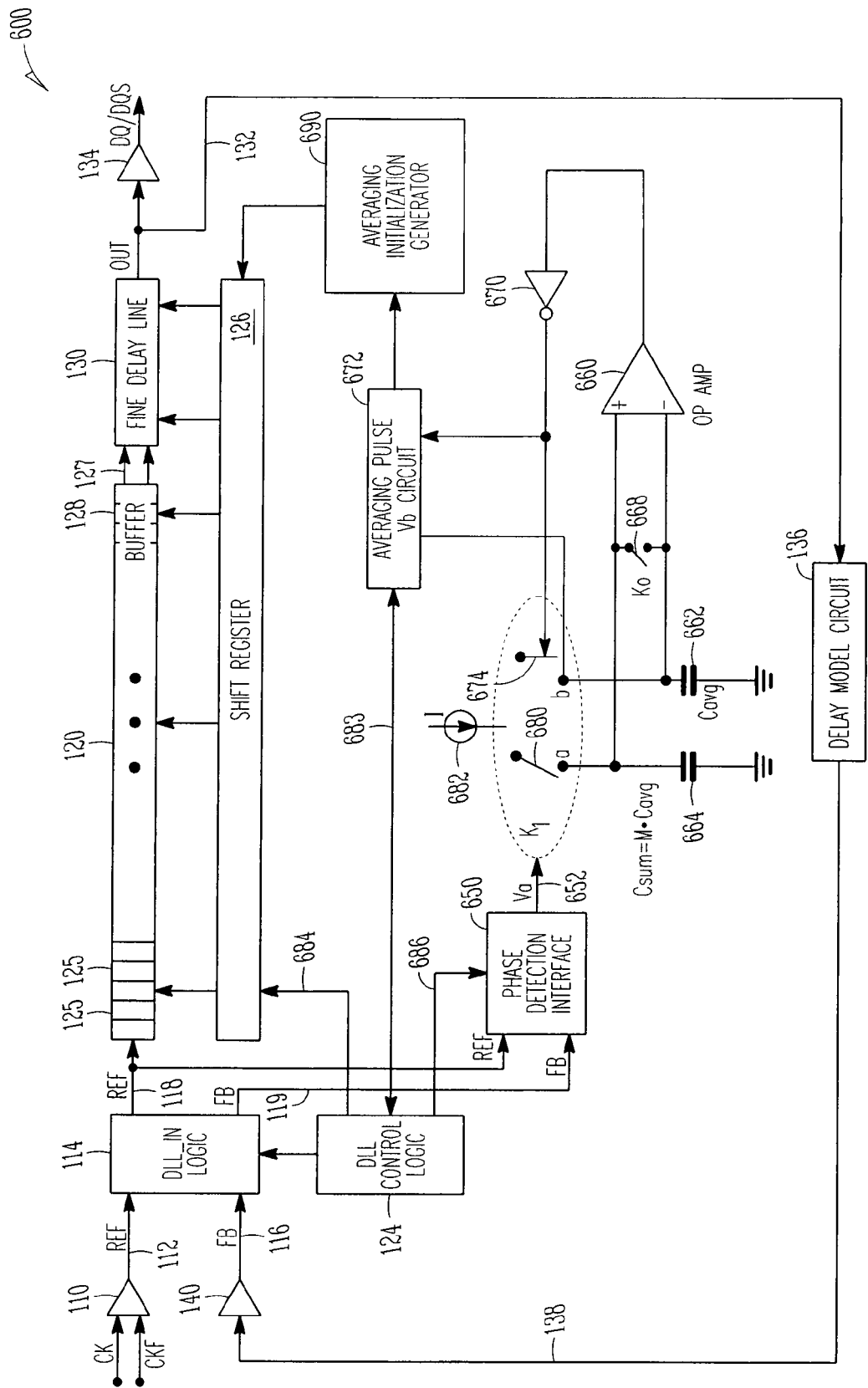
FIG. 6 is a block diagram of a DLL including an electrical schematic diagram of a circuit in the DLL according to an embodiment of the invention.
Figure 7:
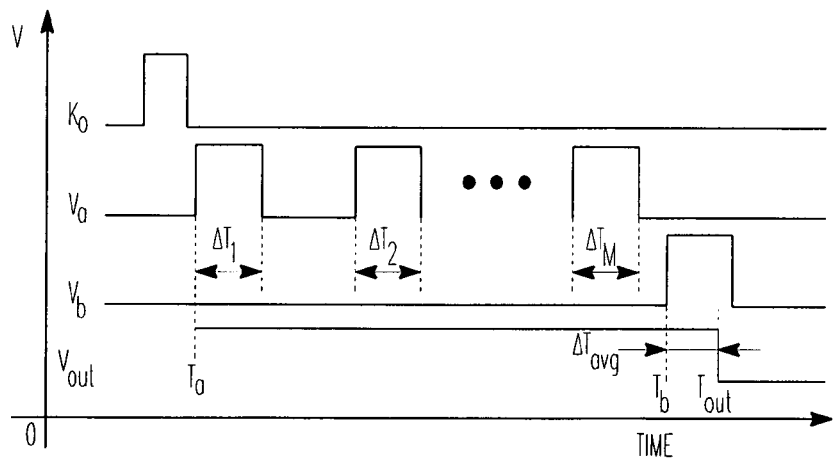
FIG. 7 is a diagram of timing relationship signals associated with the circuit of FIG. 6 according to an embodiment of the invention.
Figure 8:
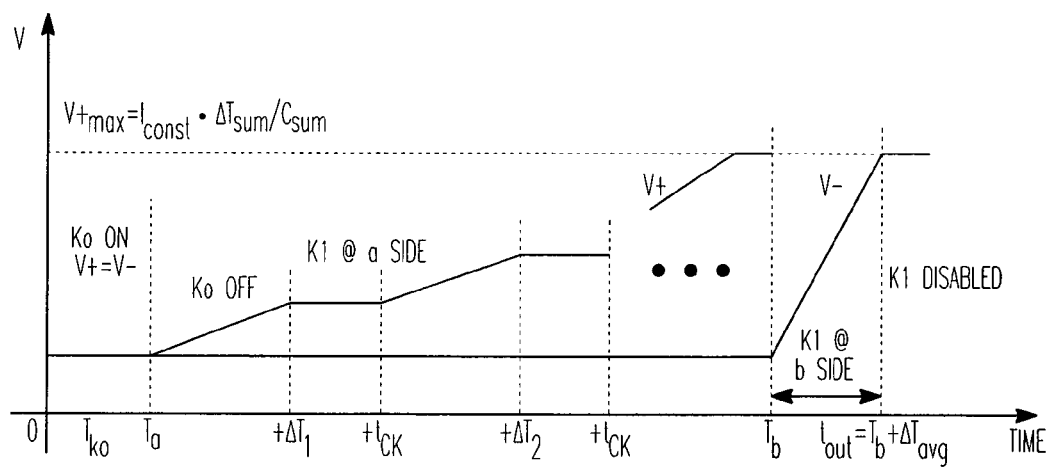
FIG. 8 is a diagram of voltages associated with the circuit of FIG. 6 according to an embodiment of the invention.

FIG. 6 is a block diagram of a DLL 600 including an electrical schematic diagram of a circuit in the DLL 600 according to an embodiment of the invention. The DLL 600 includes many elements similar to the DLL 100 shown in FIG. 1, and such similar elements have been given the same reference numerals and will not be described further herein for purposes of brevity. FIG. 7 is a diagram of timing relationship signals associated with the circuit of FIG. 6 according to an embodiment of the invention. FIG. 8 is a diagram of voltages associated with the circuit of FIG. 6 according to an embodiment of the invention.

A phase detection interface circuit 650 is coupled to receive the reference signal on the line 118 and the feedback signal on the line 119, and to generate a voltage Va on a line 652, shown in FIG. 7, that is high during a phase difference between the reference signal on the line 118 and the feedback signal on the line 119. The voltage Va may be called a phase difference signal. An operational amplifier 660 operates as a full swing comparator between an average capacitance Cavg 662 coupled to an inverting input of the operational amplifier 660, and a larger capacitance Csum 664 coupled to a non-inverting input of the operational amplifier 660. The larger capacitance Csum is approximately equal to an integer M multiple of the smaller capacitance Cavg. The operational amplifier 660, the capacitance Cavg 662, and the capacitance Csum 664 are included in an analog circuit used to determine an average of a phase difference between the reference signal on the line 118 and the feedback signal on the line 119 based on M samples of the phase difference.

An output of the operational amplifier 660 is coupled to an input of an inverter 670, and an output of the inverter 670 is coupled to an averaging pulse Vb circuit 672 and to a disable switch 674 as will be described below. A switch $K_1$ 680 is coupled between a current source 682, a first node a coupled to the larger capacitance Csum and a second node b coupled to the smaller capacitance Cavg 662. The switch $K_1$ 680 toggles back and forth between the node a and the node b as will be described below. The averaging pulse Vb circuit 672 is coupled to exchange information with the control logic circuit 124 over a line 683. The control logic circuit 124 is also coupled to send information to the shift register 126 over a line 684, and is coupled to send information to the phase detection interface circuit 650 over a line 686.

FIG. 7 shows the voltage $V_a$ on the line 652 which is high during intervals of a phase difference between the reference signal on the line 118 and the feedback signal on the line 119. A voltage $V_b$ indicates the voltage on the node b that will be described below. A pulse is shown that controls a switch $K_0$ 668 that couples the inverting and non-inverting inputs of the operational amplifier 660 when the pulse is high. Also shown in FIG. 7 is an output signal $V_{out}$ on the output of the operational amplifier 660.

As shown in FIG. 8, initially, the switch $K_0$ 668 couples the inverting and non-inverting inputs of the operational amplifier 660 such that a substantially negligible voltage difference occurs between them before a time $T_a$. When the voltage $V_a$ is high, the switch $K_1$ 680 is coupled between the current source 682, the node a, and the larger capacitance Csum to charge the capacitance Csum. As shown in FIG. 8 between time $T_a$ and time $T_b$, a potential on the larger capacitance Csum rises whenever $V_a$ is high during a phase difference between the reference signal on the line 118 and the feedback signal on the line 119. The larger capacitance Csum 664 is charged M times before it reaches a maximum voltage and at the end of M samples of the phase difference.

In FIG. 8, the voltage $V_a$ goes low after the capacitance Csum 664 is charged M times, and, after a suitable delay, the voltage $V_b$ is controlled to go high at a time $T_b$ to couple the switch $K_1$ 680 between the current source 682 and the node b to charge the smaller capacitance Cavg 662. The capacitance Cavg 662 has a voltage that rises faster than the voltage on the larger capacitance Csum 664 as is shown in FIG. 8. When a potential on the smaller capacitance Cavg exceeds the potential on the larger capacitance Csum, the operational amplifier 660 generates a low output signal $V_{out}$ coupled to the input of the inverter 670. The inverter 670 then generates a high signal to cause the disable switch 674 to disable the switch $K_1$ 680 and to indicate to the averaging pulse $V_b$ circuit 672 that the capacitance Cavg is charged. The interval between the rise of the voltage $V_b$ and the fall of the output signal $V_{out}$ is approximately equal to the average phase difference between the reference signal on the line 118 and the feedback signal on the line 119, and is shown as $\Delta T_{avg}$ in FIG. 8. The voltage $V_b$ is brought low following the fall of the output signal $V_{out}$.

The averaging pulse $V_b$ circuit 672 generates an average initialization pulse having a duration approximately equal to the interval between the rise of the voltage $V_b$ and the fall of the output signal $V_{out}$. The average initialization pulse is coupled to an averaging initialization generator circuit 690. The averaging initialization generator circuit 690 sends an enable token through the variable delay lines 120,130 starting from a beginning edge of the average initialization pulse and stopping on a disable edge of the average initialization pulse. Shift control logic (not shown) is then used to latch in or register binary bits in the shift register 126 based on the enable token to latch a new delay into the DLL 600.

Figure 9:
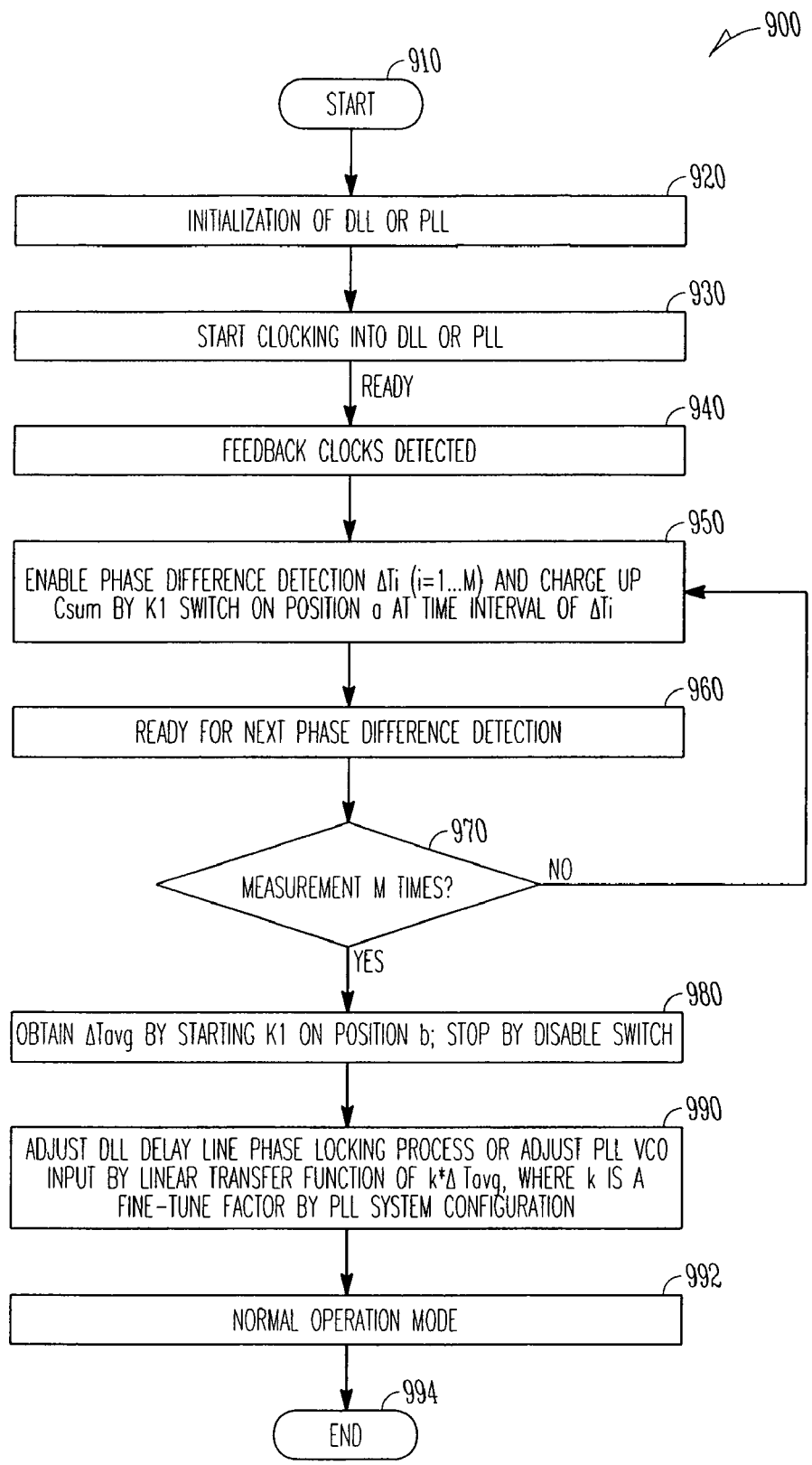
FIG. 9 is a flow diagram of several methods associated with FIG. 6 according to an embodiment of the invention.

FIG. 9 is a flow diagram of several methods 900 associated with FIG. 6 according to an embodiment of the invention. The methods 900 generally express the operation of the DLL 100. The methods also express the operation of a PLL including similar elements and this PLL portion is described herein below.

The methods 900 start in block 910. In block 920, the DLL 600 is initialized. In block 930, the reference signal on the line 112 begins to be generated and clocked into the interface control circuit 114. In block 940, the feedback signal on the line 116 is detected. In block 950, the phase detection interface circuit 650 is enabled to detect multiple phase differences $\Delta Ti$ between the reference signal on the line 118 and the feedback signal on the line 119 where i ranges from 1 to an integer M. The phase detection interface circuit 650 is enabled to generate the voltage $V_a$ such that the switch $K_1$ 680 is coupled to charge the larger capacitance Csum. In block 960, the phase detection interface circuit 650 is made ready to detect the next phase difference $\Delta Ti$. In block 970, the methods 900 determine if M phase differences $\Delta T$ have been measured, and if not, the methods 900 return to block 950 where another phase difference $\Delta Ti$ is detected.

If the methods 900 determine in block 970 that M samples $\Delta Ti$ of the phase difference $\Delta T$ have been measured and the capacitance Csum 664 is charged M times, then in block 980 the switch $K_1$ 680 is coupled to the node b to charge the smaller capacitance Cavg. Once the capacitance Cavg is charged, the disable switch 674 is caused to disable the switch $K_1$ 680. In block 990, the averaging initialization generator circuit 690 updates the shift register 126 with new binary bits to adjust the phase locking of the variable delay lines 120,130. In block 992, a normal operation mode begins, and in block 994, the methods 900 end.

Figure 10:
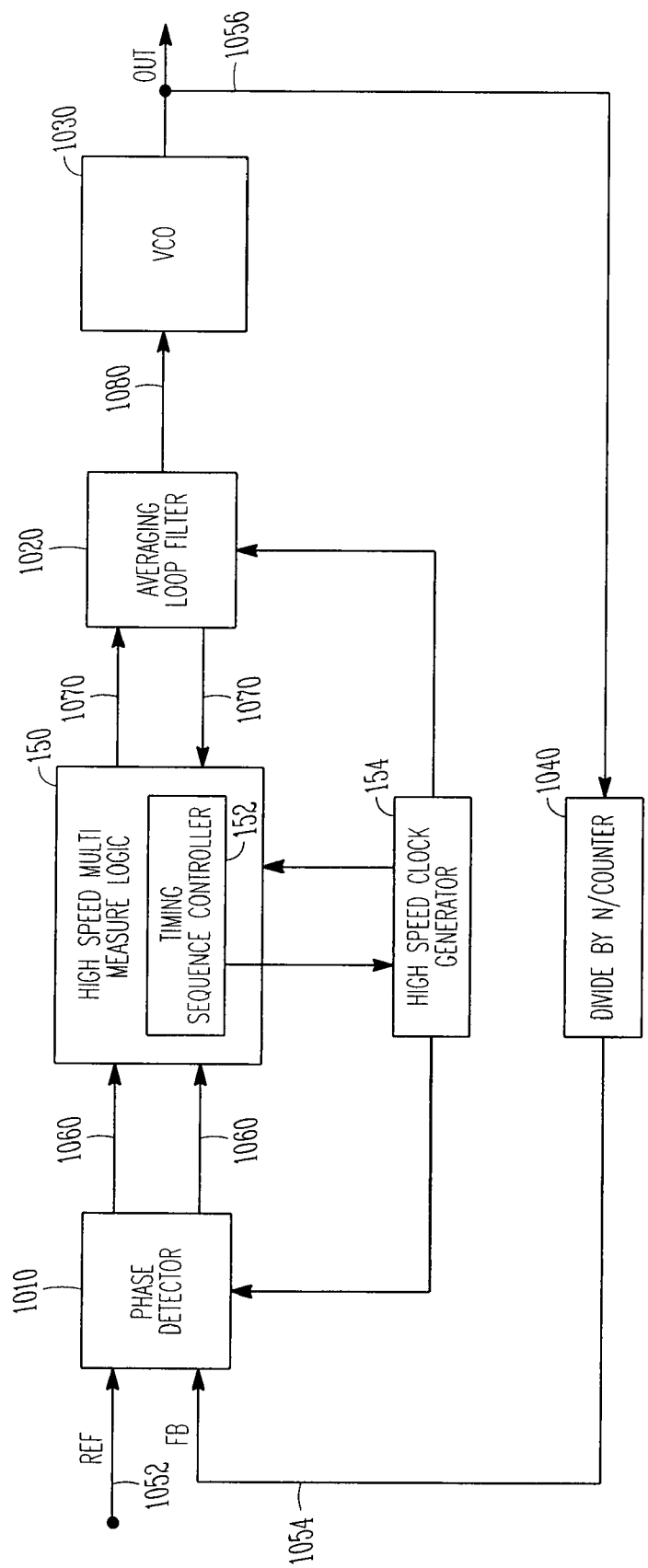
FIG. 10 is a block diagram of a PLL according to an embodiment of the invention.

FIG. 10 is a block diagram of a PLL 1000 according to an embodiment of the invention. The PLL 1000 includes a phase detector 1010, an averaging loop filter 1020, a voltage controlled oscillator (VCO) 1030, and a divide-by-N counter 1040. The PLL 1000 also includes digital circuits similar to the circuits shown in FIG. 1, including the high speed multi-measure logic circuit 150, the timing sequence controller circuit 152, and the high speed clock generator circuit 154. The circuits 150, 152, and 154 are given the same reference numerals in the PLL 1000, and operate in a manner similar to the operation described with reference to FIG. 1; this operation will not be further described for purposes of brevity.

The PLL 1000 aligns a rising edge of a reference signal on a line 1052 to a feedback signal on a line 1054 coupled to the phase detector 1010. The VCO 1030 oscillates to generate an output signal on a line 1056 at a frequency that determines the phase and frequency of the feedback signal on the line 1054. The phase detector 1010 detects a phase difference between the reference signal on the line 1052 and a feedback signal on the line 1054. Information about the phase difference is coupled in a phase difference signal to the high speed multi measure logic circuit 150 over lines 1060.

The high speed multi-measure logic circuit 150 generates information based on an average of multiple samples of the phase difference between the signals on the lines 1052 and 1054, and exchanges this information with the averaging loop filter 1020 over lines 1070. Based on this information, the averaging loop filter 1020 determines whether the VCO 1030 needs to operate at a higher or lower frequency, and generates a control voltage on a line 1080 that is coupled to bias the voltage controlled oscillator 1030. The VCO 1030 oscillates to generate the output signal on the line 1056, and stabilizes once the reference signal on the line 1052 and the feedback signal on the line 1054 have the same phase and frequency. When the reference signal and the feedback signal are aligned, the PLL 1000 is considered locked. The divide-by-N counter 1040 increases the frequency of the VCO 1030 above the frequency of the reference signal on the line 1052.

The methods 300 shown in FIG. 3 are altered slightly according to the structure of the PLL 1000 shown in FIG. 10. In block 312, the PLL 1000 is initialized (e.g. reset). In block 320, the reference signal on the line 1052 begins to be generated and clocked into the phase detector 1010. In block 330, the feedback signal on the line 1154 is detected. In block 380, the input of the VCO 1030 is adjusted by a linear transfer function of k*$\Delta$Davg where k is a fine-tune factor in the PLL 1000 system configuration.

Figure 11:
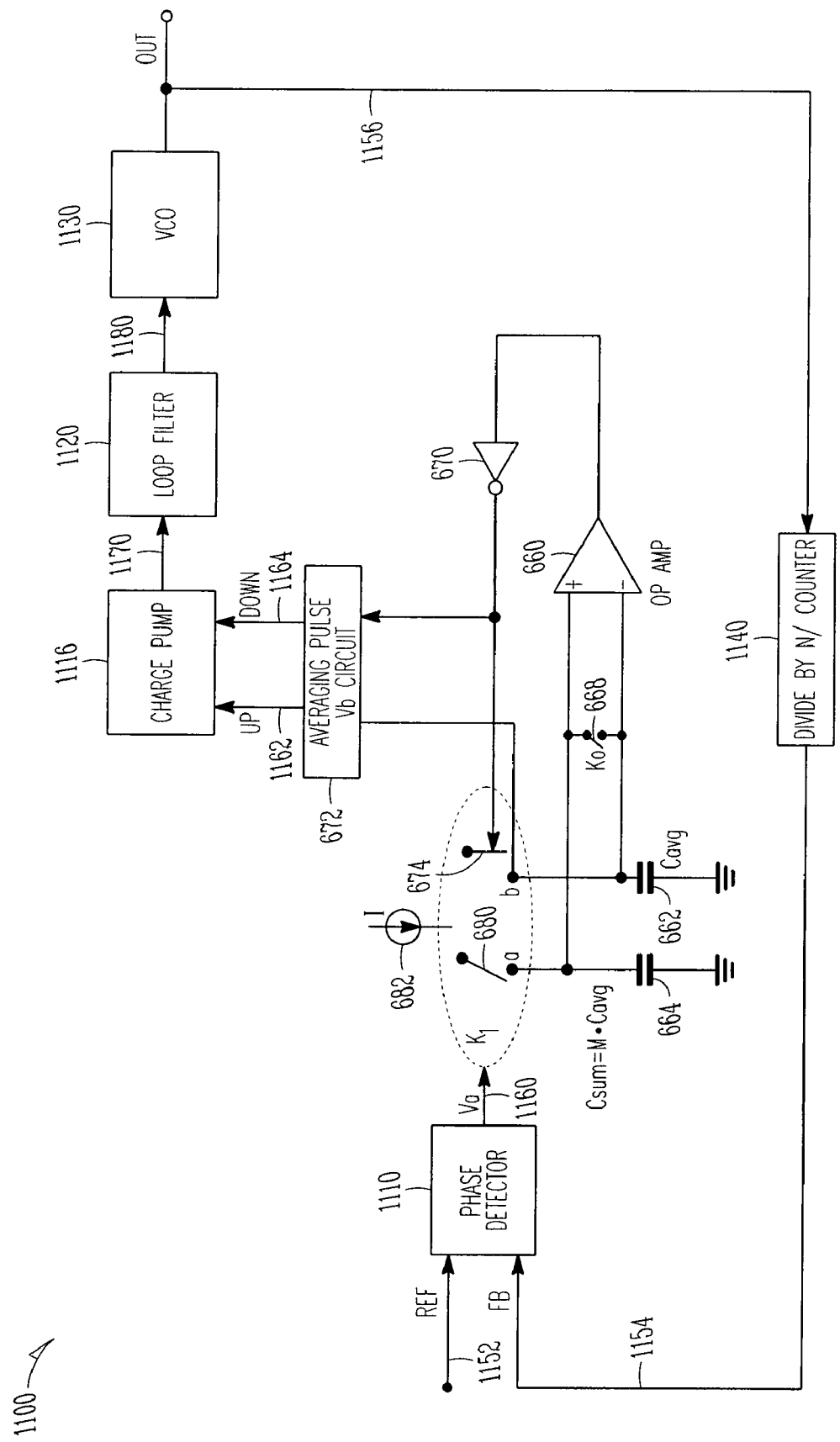
FIG. 11 is a block diagram of a PLL according to an embodiment of the invention.

FIG. 11 is a block diagram of a PLL 1100 according to an embodiment of the invention. The PLL 1100 includes a phase detector 1110, a charge pump 1116, a loop filter 1120, a VCO 1130, and a divide-by-N counter 1140. The PLL 1100 also includes analog circuits similar to the circuits shown in FIG. 6, including the operational amplifier 660, the average capacitance Cavg 662, and the larger capacitance Csum 664. The circuit elements shown in FIG. 6 are given the same reference numerals in the PLL 1100, and operate in a manner similar to the operation described with reference to FIG. 6; this operation will not be further described for purposes of brevity.

The PLL 1100 aligns a rising edge of a reference signal on a line 1152 to a feedback signal on a line 1154 coupled to the phase detector 1110. The VCO 1130 oscillates to generate an output signal on a line 1156 at a frequency that determines the phase and frequency of the feedback signal on the line 1154. The phase detector 1110 detects a phase difference between the reference signal on the line 1152 and a feedback signal on the line 1154. The phase detector 1110 generates the voltage $V_a$ on a line 1160 based on information about the phase difference. The voltage $V_a$ may be called a phase difference signal. The averaging pulse $V_b$ circuit 672 generates an up signal on a line 1162 or a down signal on a line 1164 coupled to the charge pump 1116 based on an average of multiple samples of the phase difference between the signals on the lines 1152 and 1154. If the charge pump 1116 receives an up signal, current is driven into the loop filter 1120 on a line 1170. Conversely, if the charge pump 1116 receives a down signal, current is drawn from the loop filter 1120 on the line 1170.

The loop filter 1120 converts these signals to a control voltage on a line 1180 that is used to bias the VCO 1130. Based on the control voltage, the VCO 1130 oscillates at a higher or lower frequency to generate the output signal on the line 1156 which affects the phase and frequency of the feedback signal on the line 1154. The VCO 1130 stabilizes once the reference signal on the line 1152 and the feedback signal on the line 1154 have the same phase and frequency. When the reference signal and the feedback signal are aligned, the PLL 1100 is considered locked. The divide-by-N counter 1140 increases the frequency of the VCO 1130 above the frequency of the reference signal on the line 1152.

The methods 900 shown in FIG. 9 are altered slightly according to the structure of the PLL 1100 shown in FIG. 11. In block 920, the PLL 1100 is initialized (e.g. reset). In block 930, the reference signal on the line 1152 begins to be generated and clocked into the phase detector 1110. In block 940, the feedback signal on the line 1154 is detected. In block 990, the input of the VCO 1130 is adjusted by a linear transfer function of k*ΔTavg, where k is a fine-tune factor in the PLL 1100 system configuration.

Embodiments of the invention described herein determine an average phase difference between a periodic output signal and a periodic input signal from an average of a plurality of samples of a phase difference between the output signal and the input signal. A phase of the output signal is then adjusted based on the average phase difference.

In some embodiments of the invention, the phase of the output signal may be adjusted based on other mathematical treatment of the samples of the phase difference. In some embodiments of the invention, a calculated phase difference may be calculated by alternately adding and subtracting succeeding samples of the phase difference. For example, the calculated phase difference may be equal to a phase difference of sample A− a phase difference of sample B+ a phase difference of sample C− a phase difference of sample D+ a phase difference of sample E. In some embodiments of the invention, the signs in the above equation are reversed, or more samples are included in the calculation.

In some embodiments of the invention, the calculated phase difference may be calculated by adding or subtracting differently weighted samples of the phase difference. For example, the calculated phase difference may be equal to k1* phase difference of sample A+/−k2* phase difference of sample B+/−k3* phase difference of sample C where k1, k2, and k3 are different weighting factors. In some embodiments of the invention, the signs in the above equation are reversed, or more samples are included in the calculation. In some embodiments of the invention, the calculated phase difference may be calculated from a least variance approximation of the samples of the phase difference. In some embodiments of the invention, the calculated phase difference may be calculated from a least squares estimate of the samples of the phase difference. In some embodiments of the invention, the calculated phase difference may be calculated from an Nth root of a product of the samples of the phase difference.

Embodiments of the invention described herein may be included in electronic circuitry used in high-speed computers, communication and signal processing circuitry, single or multi-processor modules, single or multiple embedded processors, multi-core processors, data switches, and application-specific modules including multilayer, multi-chip modules. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others. Thus, many more embodiments may be realized, some of which are described below.

Figure 12:
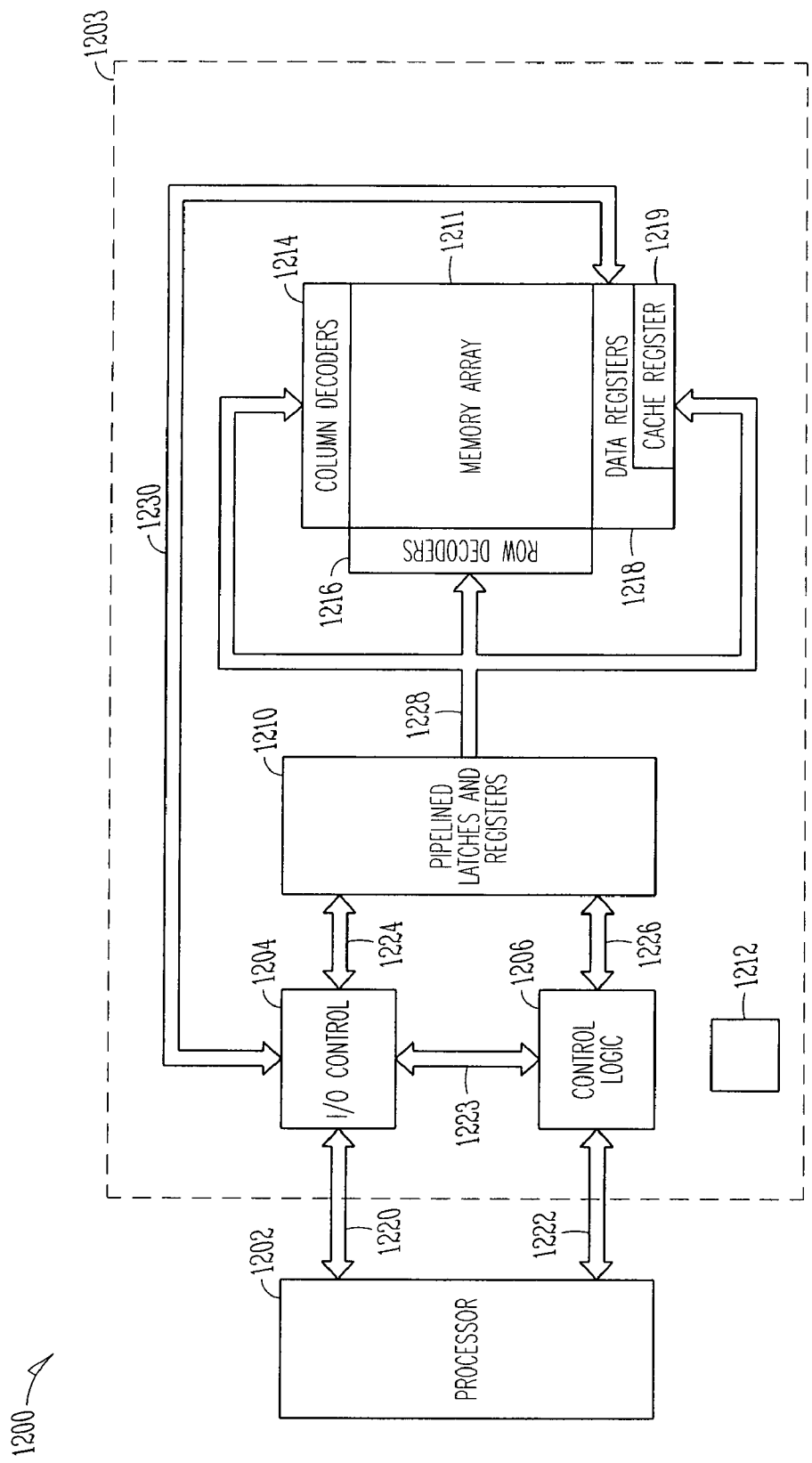
FIG. 12 is a block diagram of a system according to an embodiment of the invention.

FIG. 12 is a block diagram of a system 1200 according to an embodiment of the invention. The system 1200 includes a processor 1202 and a memory device 1203 that includes an input/output (I/O) control block 1204, a control logic block 1206, a pipelined latches and registers block 1210, and a memory array 1211. In some embodiments, the memory array 1211 comprises a NAND flash memory array, a NOR flash memory array, or a SDRAM array.

The memory device 1203 includes a DLL or a PLL 1212 to generate a periodic signal such as a clock signal according to embodiments of the invention described herein.

In some embodiments, the processor 1202 and the memory device 1203 may be included on a single integrated circuit. In an embodiment of the invention, the memory device 1203 may be included as removable storage such as flash cards and USB Flash drives, and may be included as embedded storage for cell phones, digital cameras, wireless/handheld devices, and MP3 players.

The system 1200 includes column decoders 1214, row decoders 1216, and a data registers block 1218. The column decoders 1214 are coupled to the memory array 1211 and provide column selection signals. The row decoders 1216 are coupled to the memory array 1211 and provide row selection signals. The data registers block 1218 is coupled to the memory array 1211. The data registers block 1218, in an embodiment of the invention, includes one or more data registers for transferring data to and from the memory array 1211. In some embodiments, the data registers block 1218 may include cache registers 1219.

In the system 1200, the processor 1202 may be coupled to the I/O control block 1204 thorough an interconnect 1220 and the control logic block 1206 through an interconnect 1222. The I/O control block 1204 may be coupled to the control logic block 1206 through an interconnect 1223. The pipelined latches and registers block 1210 may be coupled to the I/O control block 1204 through an interconnect 1224 and to the control logic block 1206 through an interconnect 1226. The pipelined latches and registers block 1210 may be connected through an interconnect 1228 to the column decoders 1214, the row decoders 1216, and to the data registers 1218. In some embodiments, the data registers 1218, including the cache registers 1219 if present, may be coupled to the I/O control block 1204 through and interconnect 1230.

The interconnects 1220, 1222, 1223, 1224, 1226, 1228, and 1230 are not limited to any particular type of interconnects. In some embodiments, one or more of these interconnects may include a plurality of individual conductors operating in parallel to transfer data. Serial connections may also be made. In some embodiments, one or more of these interconnects may include a wireless interconnect. The interconnects 1220, 1222, 1223, 1224, 1226, 1228, and 1230 are not limited to being the same type of interconnects, and the system 1200 may include a variety of interconnects 1220, 1222, 1223, 1224, 1226, 1228, and 1230, perhaps used in combination.

In operation, the processor 1202 provides a plurality of control signals through the interconnect 1222 to the control logic block 1206 to control operations performed on the memory array 1211. Operations the processor 1202 performs in controlling the memory array 1211 include, but are not limited to, reading data from the memory array 1211, writing data to the memory array 1211, and erasing one or more portions of the memory array 1211. In order to perform an operation, the processor 1202 provides to the I/O control block 1204 a series of command signals, address signals, and data signals through the interconnect 1220, and the command signals, the address signals, and the data signals are all used in performing the operation.

In some embodiments, the command signals, the address signals, and the data signals may be sent as a series of serial bytes from the processor 1202 though the interconnect 1220 to the I/O control block 1204, and are latched into latches included in the pipelined latches and registers block 1210. In some embodiments, the command signals may be decoded and provided to the control logic block 1206 for the control logic block 1206 to generate internal signals for controlling the operation being performed on the memory array 1211. Further, the address signals may be latched into the pipelined latches and registers block 1210, and provided to the column decoder 1214 and to the row decoder 1216 to control a portion of the memory array 1211 on which an operation is being performed. Data signals are latched into registers of the pipelined latches and registers block 1210 and are provided to data registers 1218, for example, during write operations to the memory array 1211.

During operations on the memory array 1211, the processor 1202 may also provide one or more control signals through the interconnect 1222 to the control logic block 1206. These control signals are provided and coordinated with the signals provided by the processor 1202 to the I/O control block 1204 to control the operations performed on the memory array 1211. In addition, the control logic block 1206 may provide one or more internally generated control signals to the I/O control block 1204 and to the pipelined latches and registers block 1210 to control the operations performed on memory array 1211.

Figure 13:
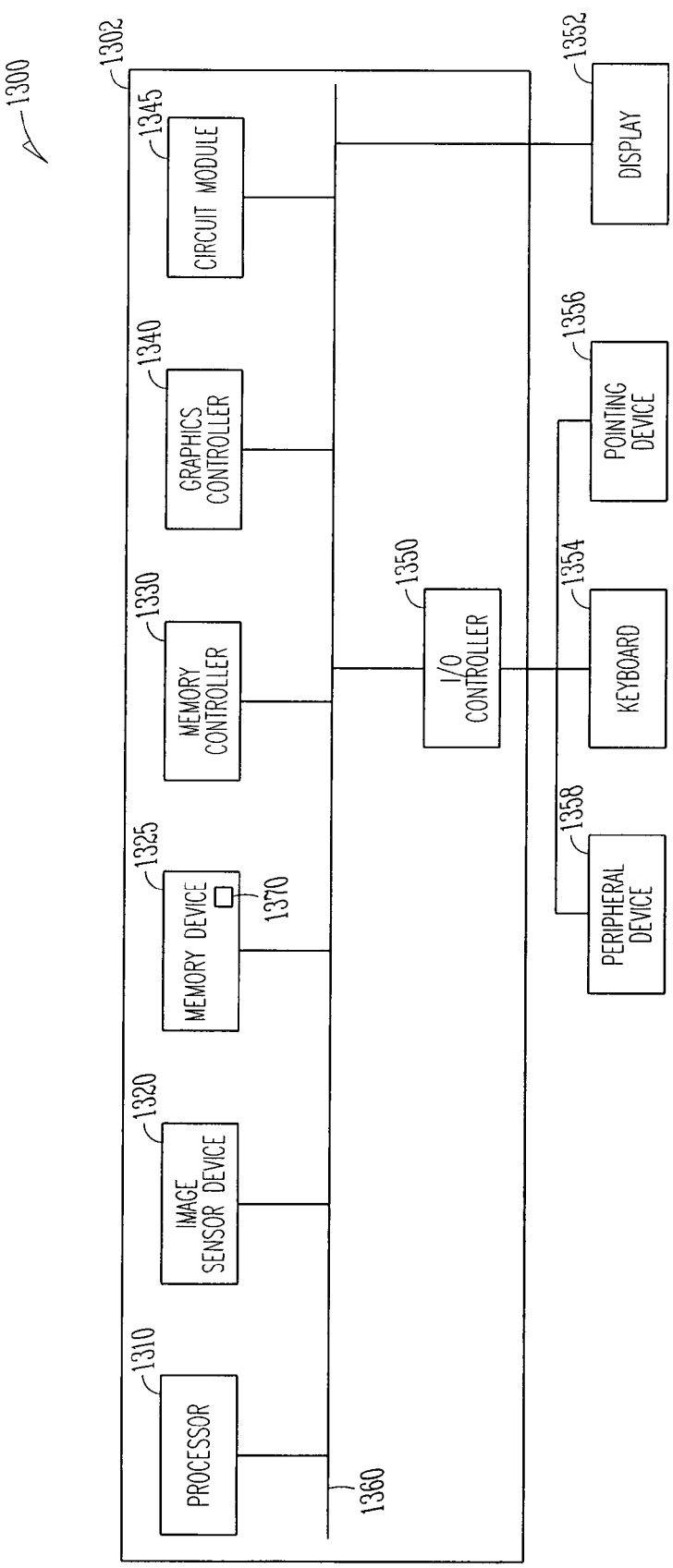
FIG. 13 is a block diagram of a system according to an embodiment of the invention.

FIG. 13 is a block diagram of a system 1300 according to an embodiment of the invention. The system 1300 may include a processor 1310, an image sensor device 1320, a memory device 1325, a memory controller 1330, a graphics controller 1340, a circuit module 1345, an I/O controller 1350, a display 1352, a keyboard 1354, a pointing device 1356, a peripheral device 1358, and a bus 1360 to transfer information among the components of system 1300. The system 1300 may also include a circuit board 1302 on which some components of the system 1300 may be located. In some embodiments, the number of components of system 1300 may vary. For example, in some embodiments, the system 1300 may omit one or more of the display 1352, the image sensor device 1320, the memory device 1325, and the circuit module 1345.

The memory device 1325 includes a DLL or a PLL 1370 to generate a periodic signal such as a clock signal according to embodiments of the invention described herein. One or more of the processor 1310, the image sensor device 1320, the memory controller 1330, the graphics controller 1340, the circuit module 1345, the I/O controller 1350, the display 1352, the keyboard 1354, the pointing device 1356, and the peripheral device 1358 may also include a DLL or a PLL to generate a periodic signal such as a clock signal according to embodiments of the invention described herein.

The processor 1310 may include a general-purpose processor or an application specific integrated circuit (ASIC). The processor 1310 may comprise a single core processor or a multiple-core processor. The processor 1310 may execute one or more programming commands to process information to provide processed information. The information may include digital output information provided by other components of the system 1300, such as the image sensor device 1320 or the memory device 1325.

The image sensor device 1320 may include a complementary metal-oxide-semiconductor (CMOS) image sensor having a CMOS pixel array or a charge-coupled device (CCD) image sensor having a CCD pixel array.

The memory device 1325 of FIG. 13 may include a volatile memory device, a non-volatile memory device, or a combination of both. For example, the memory device 1325 may comprise a DRAM device, a static random access memory (SRAM) device, a flash memory device, or a combination of these memory devices.

The display 1352 may include an analog display or a digital display. The display 1352 may receive information from other components. For example, the display 1352 may receive information that is processed by one or more of the image sensor device 1320, the memory device 1325, the graphics controller 1340, and the processor 1310 to display information such as text or images.

The circuit module 1345 may include a circuit module of a vehicle. The circuit module 1345 may receive information from other components to activate one or more subsystem of the vehicle. For example, the circuit module 1345 may receive information that is processed by one or more of the image sensor device 1320, the memory device 1325, and the processor 1310 to activate one or more of an air bag system of a vehicle, a vehicle security alarm, and obstacle alert system.

The individual activities of methods 300, 400, 500, and 900 may not have to be performed in the order shown or in any particular order. Some activities may be repeated, and others may occur only once. Embodiments of the invention may have more or fewer activities than those shown in FIGS. 3, 4, 5, and 9.

Any of the circuits or systems described herein may be referred to as a module. A module may be a circuit or firmware according to embodiments of the invention.

The above description and the drawings illustrate some embodiments of the invention to enable those skilled in the art to practice the embodiments of the invention. Other embodiments may incorporate structural, logical, electrical, process, and other changes. In the drawings, like features or like numerals describe substantially similar features throughout the several views. Examples merely typify possible variations. Portions and features of some embodiments may be included in, or substituted for, those of others. Many other embodiments will be apparent to those skilled in the art upon reading and understanding the above description. Therefore, the scope of an embodiment of the invention of the invention is determined by the appended claims, along with the full range of equivalents to which such claims are entitled.

The Abstract is provided to comply with 37 C.F.R. §1.72(b) requiring an abstract that will allow the reader to quickly ascertain the nature of the technical disclosure. The Abstract is submitted with the understanding that it will not be used to interpret or limit the scope or meaning of the claims.

What is claimed is:

1. A method comprising:
   generating a periodic output signal from a periodic input signal generated by an oscillator;
   obtaining a plurality of samples of a phase difference between the output signal and the input signal;
   determining an average phase difference between the output signal and the input signal from the plurality of samples; and
   adjusting a phase of the output signal based on the average phase difference.

2. A method comprising:
   generating a periodic output signal from a periodic input signal;

determining an average phase difference between the output signal and the input signal over a plurality of periods of the input signal including:
  generating a multi-phase clock signal having a plurality of phases, each phase of the multi-phase clock signal having a period approximately equal to a period of the input signal;
  comparing each phase of the multi-phase clock signal to the input signal and the output signal;
  determining a phase difference between the input signal and the output signal for each of a plurality of periods of the input signal based on the comparison with the multi-phase clock signal; and
  determining an average phase difference to be an average of the phase differences determined for the plurality of periods of the input signal; and
delaying the input signal based on the average phase difference to generate the output signal.

3. A method comprising:
generating a periodic output signal from a periodic input signal;
obtaining a plurality of samples of a phase difference between the output signal and the input signal; and
adjusting a phase of the output signal based on a calculated phase difference calculated by alternately adding and subtracting succeeding samples of the phase difference.

4. A method comprising:
generating a periodic output signal from a periodic input signal;
obtaining a plurality of samples of a phase difference between the output signal and the input signal; and
adjusting a phase of the output signal based on a calculated phase difference calculated by adding or subtracting differently weighted samples of the phase difference.

5. A method comprising:
generating a periodic output signal from a periodic input signal;
obtaining a plurality of samples of a phase difference between the output signal and the input signal; and
adjusting a phase of the output signal based on a least variance approximation of the samples of the phase difference.

6. A method comprising:
generating a periodic output signal from a periodic input signal;
obtaining a plurality of samples of a phase difference between the output signal and the input signal; and
adjusting a phase of the output signal based on a least squares estimate of the samples of the phase difference.

7. A method comprising:
generating a periodic output signal from a periodic input signal;
obtaining a plurality of samples of a phase difference between the output signal and the input signal; and
adjusting a phase of the output signal based on an Nth root of a product of the samples of the phase difference.

8. A method comprising:
generating a periodic output signal from a periodic input signal;
comparing the output signal and the input signal with a selected clock signal;
measuring a phase difference between the output signal and the input signal from the comparison with the selected clock signal; and
adjusting a phase of the output signal based on the comparison of the output signal and the input signal with the selected clock signal.

9. The method of claim 8, further comprising generating the selected clock signal as a multi-phase clock signal having a plurality of phases, each phase of the multi-phase clock signal having a period approximately equal to a period of the input signal.

10. The method of claim 8, further comprising:
determining an average phase difference between the output signal and the input signal over a plurality of periods of the input signal, wherein adjusting a phase of the output signal includes adjusting the phase of the output signal based on the average phase difference.

11. The method of claim 8, further comprising:
determining a calculated phase difference between the output signal and the input signal over a plurality of periods of the input signal by adding or subtracting differently weighted samples of the measured phase difference, wherein adjusting a phase of the output signal includes adjusting the phase of the output signal based on the calculated phase difference.

12. The method of claim 8, further comprising:
calculating a least variance approximation of samples of the measured phase difference over a plurality of periods of the input signal, wherein adjusting a phase of the output signal includes adjusting the phase of the output signal based on the least variance approximation.

13. The method of claim 8, further comprising:
determining an average phase difference between the output signal and the input signal over a plurality of periods of the input signal;
generating an up signal or a down signal on a line coupled to a charge pump in a phase lock loop (PLL) based on the average phase difference;
driving current into a loop filter in the PLL from the charge pump if the charge pump receives an up signal;
drawing current from the loop filter into the charge pump if the charge pump receives a down signal;
generating a control voltage in the loop filter based on the current received from the charge pump; and
wherein adjusting a phase of the output signal includes adjusting the phase of the output signal based on oscillations from a voltage controlled oscillator (VCO) having a frequency based on the control voltage from the loop filter.

14. The method of claim 8, further comprising:
obtaining multiple samples of the phase difference between the output signal and the input signal over a plurality of periods of the input signal; and
converting the samples of the phase difference into digital data.

15. The method of claim 14, further comprising:
generating an average value of the digital data;
generating an average pulse width based on the average value; and
wherein adjusting a phase of the output signal includes adjusting the phase of the output signal based on the average pulse width.

16. The method of claim 8, further comprising:
for each of a plurality of periods of the input signal:
  comparing the input signal and the output signal with a plurality of multi-phase clock signals;
  for a transition of each phase of the multi-phase clock signals occurring between a transition of the input signal and a corresponding transition of the output signal, incrementing a counter, a counter being incremented for each phase of the multi-phase clock signals;

setting a maximum coarse value to be equal to a highest value in any of the counters;

setting a fine value to be equal to the number of counters having the highest value;

generating an average maximum coarse value from the maximum coarse values;

generating an average fine value from the fine values;

generating an average pulse width based on the average maximum coarse value and the average fine value; and wherein adjusting a phase of the output signal includes adjusting the phase of the output signal based on the average pulse width.

17. An apparatus comprising:

a clock generator to generate a selected clock signal;

a phase detector having a first input coupled to receive a periodic input signal, a second input coupled to receive a periodic output signal, and an output, the phase detector to generate a phase difference signal on the output indicating a phase relationship between the input signal and the output signal;

a digital circuit coupled to the output of the phase detector to receive the phase difference signal and coupled to the clock generator to receive the selected clock signal, the digital circuit to compare the phase difference signal with the selected clock signal to generate a plurality of phase difference measurements over a plurality of periods of the input signal, and to calculate an average phase difference from an average of the phase difference measurements; and an output circuit coupled to the digital circuit to adjust a phase of the output signal based on the average phase difference.

18. The apparatus of claim 17, wherein the digital circuit comprises a digital signal processor.

19. The apparatus of claim 17, wherein the clock generator comprises a multi-phase clock generator to generate a multi-phase clock signal.

20. The apparatus of claim 17, wherein the output circuit comprises a delay lock loop.

* * * * *